United States Patent [19]

Salmon

[11] Patent Number: 5,008,779
[45] Date of Patent: Apr. 16, 1991

[54] SHELF ASSEMBLY HAVING INFINITELY VERTICALLY ADJUSTABLE TOP SURFACE

[75] Inventor: Garland R. Salmon, Durham, N.C.

[73] Assignee: Newton Instrument Company, Butner, N.C.

[21] Appl. No.: 542,250

[22] Filed: Jun. 21, 1990

[51] Int. Cl.⁵ .............................................. H05K 7/14
[52] U.S. Cl. ...................................... 361/415; 211/41
[58] Field of Search ........................ 211/41, 187, 98; 312/257; 361/391, 399, 415, 429

[56] References Cited

U.S. PATENT DOCUMENTS

| D. 288,160 | 2/1987 | Maroney et al. | D6/511 |
|---|---|---|---|
| 4,277,120 | 7/1981 | Drake et al. | 312/320 |
| 4,563,722 | 1/1986 | Maroney et al. | 361/212 |
| 4,638,399 | 1/1987 | Maroney et al. | 361/212 |
| 4,720,048 | 1/1988 | Maroney et al. | 280/47.34 |

*Primary Examiner*—Leo P. Picard
*Assistant Examiner*—Donald A. Sparks

[57] ABSTRACT

A shelf assembly having an infinitely vertically adjustable top surface is provided for supporting electronic circuit boards in a storage cabinet. The shelf assembly includes a shelf base having a bottom support surface and a front and rear wall wherein the front wall defines at least one horizontallly extending elongate slot therein. A vertical adjustment tray is positioned on the support surface of the shelf base and includes a front wall and rear wall which each define at least one elongate slot therein which extends generally laterally upwardly. Vertical adjustment knob elements are secured to the front wall of the vertical adjustment tray and extend through the elongate slot in the front wall of the shelf base so that lateral movement of the knob member will laterally translate the vertical adjustment tray relative to the shelf base. A shelf top is positioned on the vertical adjustment tray and movably secured relative to the shelf base so as to prevent lateral movement thereof while allowing vertical movement relative to the shelf base. The shelf top also has front and rear walls with slot engagement pegs extending inwardly therefrom and into operative engagement with at least one upwardly extending slot in each of the front and rear walls of the vertical adjustment tray whereby lateral movement of the knob elements of the shelf assembly causes the vertical adjustment tray to laterally translate relative to the shelf base and the shelf top to be vertically actuated by the lateral movement thereof.

18 Claims, 4 Drawing Sheets

SHELF ASSEMBLY HAVING INFINITELY VERTICALLY ADJUSTABLE TOP SURFACE

DESCRIPTION

1. Technical Field

The present invention relates to an infinitely vertically adjustable shelf assembly for use in storage cabinets and the like, and more particularly to an infinitely vertically adjustable shelf assembly for use in storing telecommunication electronic circuit boards in storage cabinets therefor.

2. Background Art

Circuit boards are used in large numbers by the telecommunication industry in environments such as telephone switches. As is well known to those in the telecommunications art, spare circuit boards and back-up boards must be kept available to minimize the possibility of loss of equipment and service. The circuit boards are very expensive, often costing many thousands of dollars each, and therefore these very expensive circuit boards must be properly protected during storage thereof.

Circuit boards are typically stored between adjacent shelves in large metal cabinets which are properly grounded to assure that they are not destroyed by transient static charges or uncontrolled and rapid electrostatic discharge (ESD) of components thereon subsequent to removal of the boards from a computer, switching system or the like. As is well known, static charges build on the circuit boards when in use and can damage the circuitry thereof if grounded and allowed to discharge instantly when placed in a storage cabinet.

Presently, circuit boards are conventionally stored in grounded metal cabinets in an upstanding position slidably engaged between two static conductive shelves. Unfortunately, state-of-the-art shelf assemblies for circuit board storage cabinets are not infinitely vertically adjustable in order to accommodate different size circuit boards. Quite to the contrary, conventional storage shelves known to applicant provide only very limited adjustability and thus considerable time and effort is required in order to adjust circuit board storage cabinet shelves to accommodate different size circuit boards. For example, U.S. Pat. No. 4,563,722 discloses an anti-static shelf for electronic circuit boards which requires that each corner be independently adjusted in order to vertically raise or lower the shelf and thereby increase or decrease the space between adjacent shelves so as to slidably accommodate a different size circuit board therebetween. Since all four ends of the shelf must be independently adjusted within vertical slots, it is very difficult to position each shelf surface parallel with shelves above and below as required in order for the storage cabinet to properly function.

Applicant has overcome the shortcomings of anti-static shelf assemblies presently used in cabinets for storing circuit boards for convenient retrieval when needed. The infinitely vertically adjustable shelf assembly of the invention is adapted to be easily installed within a storage cabinet and to provide infinite vertical adjustability by merely slidably adjusting selection knobs on the front thereof so as to position the top surface of the shelf assembly at a desired height. Moreover, the unique construction of applicant's shelf assembly results in the vertically adjusted shelf surface being parallel without the necessity for further adjustment or leveling thereof.

DISCLOSURE OF THE INVENTION

In accordance with the present invention, a shelf assembly having an infinitely vertically adjustable top surface for adjustably supporting electronic circuit boards in a storage cabinet is provided. The vertically adjustable shelf comprises a shelf base adapted to be secured to a storage cabinet and having a bottom support surface with a front wall extending along at least a portion of the length of the front side thereof and defining at least one generally horizontal elongate opening therein. A vertical adjustment means is positioned on the support surface of the shelf base and adapted for lateral slidable movement thereon. The vertical adjustment means comprises a front wall and rear wall extending along at least a portion of the length of the front and rear sides thereof, respectively, wherein each wall defines at least one elongate guide surface extending generally laterally upwardly. The vertical adjustment means further includes lateral movement means secured to the front wall thereof and extending through each of the at least one elongate opening in the front wall of the shelf base so that lateral movement thereof will laterally translate the vertical adjustment means relative to the shelf base. A shelf top adapted to be movably secured relative to the shelf base so as to prevent lateral movement thereof while allowing vertical movement relative to the shelf base is positioned on the vertical adjustment means and comprises a front wall and a rear wall extending along at least a portion of the length of the front and rear sides thereof, respectively, and guide surface engagement means extending inwardly from said front and rear walls and into operative engagement with the at least one upwardly extending guide surface in each of the front and rear walls of the vertical adjustment means.

In use, selective lateral movement of the vertical adjustment means in a direction to urge the guide surface engagement means of the shelf top upwardly along the guide surfaces within said vertical adjustment means serves to vertically raise the shelf top while lateral movement of the vertical adjustment means in a direction to urge the guide surface engagement means of the shelf top downwardly along the guide surfaces in the vertical adjustment means serves to vertically lower the shelf top.

It is therefore the object of the present invention to provide an infinitely vertically adjustable shelf for use in an electronic circuit board storage cabinet.

More specifically, it is the object of the present invention to provide an vertically adjustable shelf for use in an electronic circuit board storage cabinet which requires significantly less time to install and to adjust in order to accommodate electronic circuit boards of varying sizes.

It is yet another object of the present invention to provide a vertically adjustable shelf assembly for use in an electronic circuit board storage cabinet which may be easily and quickly vertically adjusted and the parallel relationship between adjacent shelves maintained without the necessity for tedious and time-consuming adjustments to the corners thereof.

It is still another object of the present invention to provide a static dissipating infinitely vertically adjustable shelf assembly for use in an electronic circuit board storage cabinet which provides for a continuum of vertical adjustments by means of a simple adjustment control in contrast to discrete and time-consuming adjustments required by conventional anti-static shelves.

BRIEF DESCRIPTION OF THE DRAWINGS

Some of the objects of the invention having been stated, other objects will become evident as the description proceeds, when taken in connection with the accompanying drawings, in which.

DETAILED DESCRIPTION OF THE PREFERRED EMBODIMENT

Figure 1:
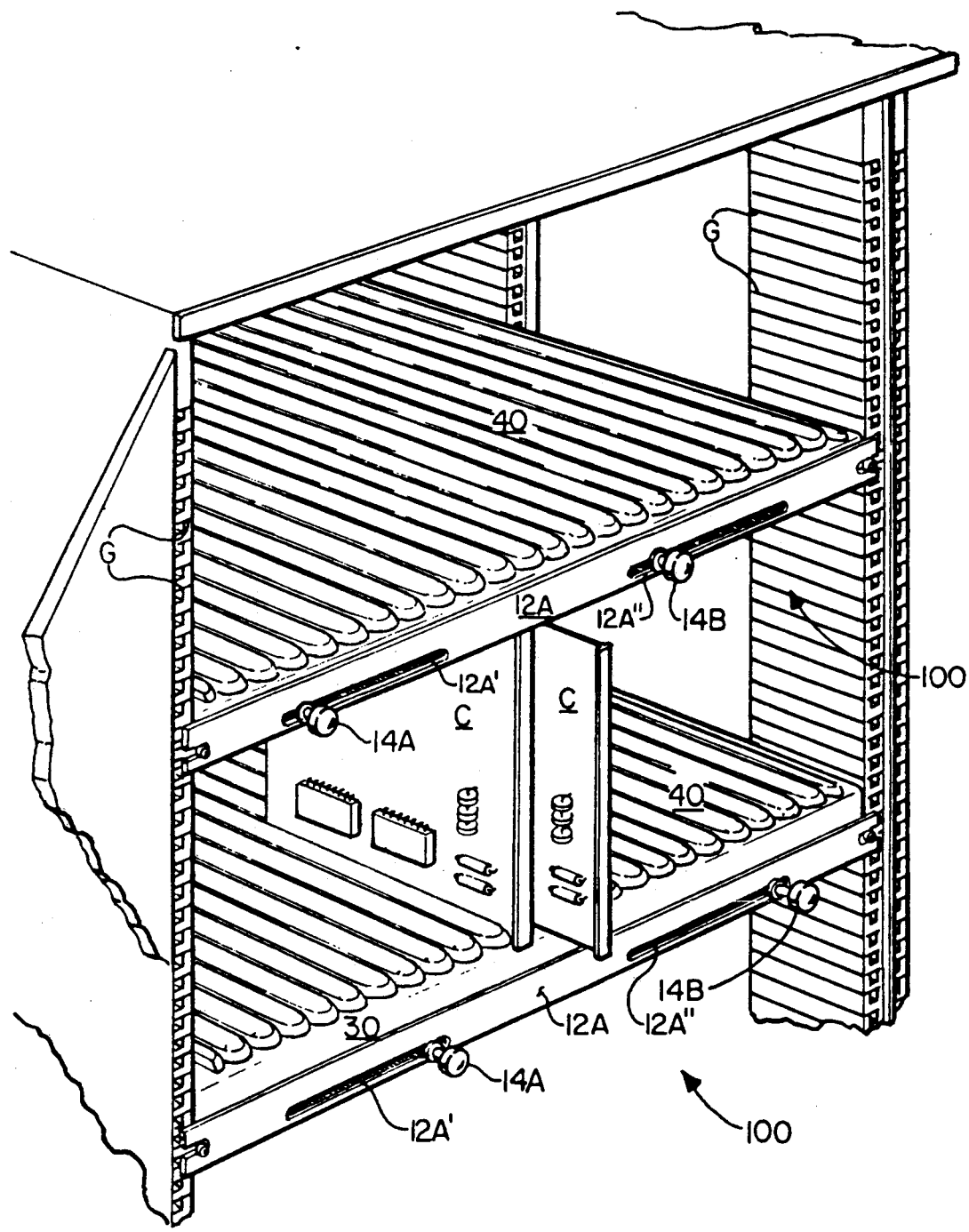
FIG. 1 is an environmental view of two shelves in accordance with the present invention positioned in a storage cabinet with electronic circuit boards removably positioned therebetween.
Figure 2:
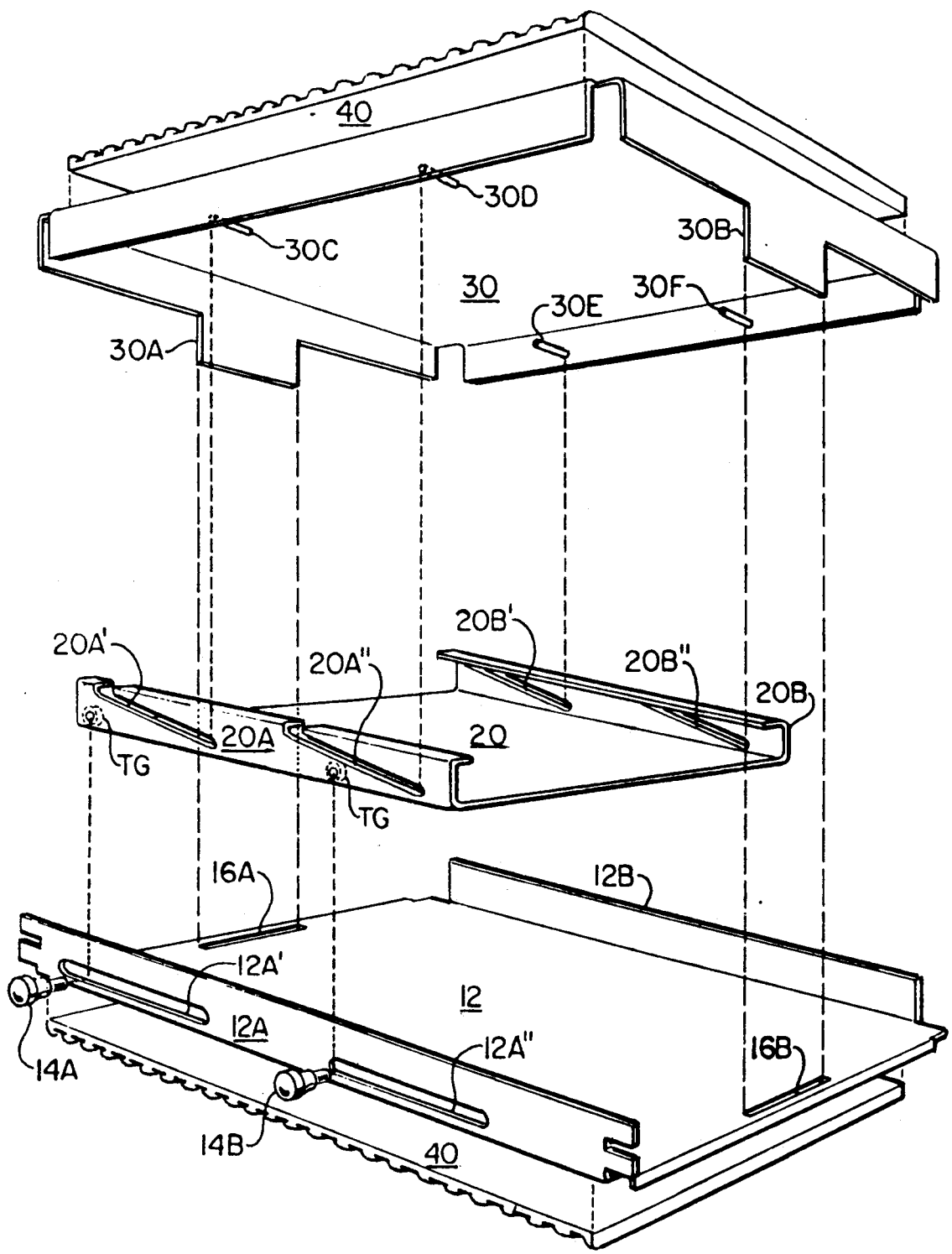
FIG. 2 is an exploded perspective view of a shelf assembly in accordance with the present invention.
Figure 3:
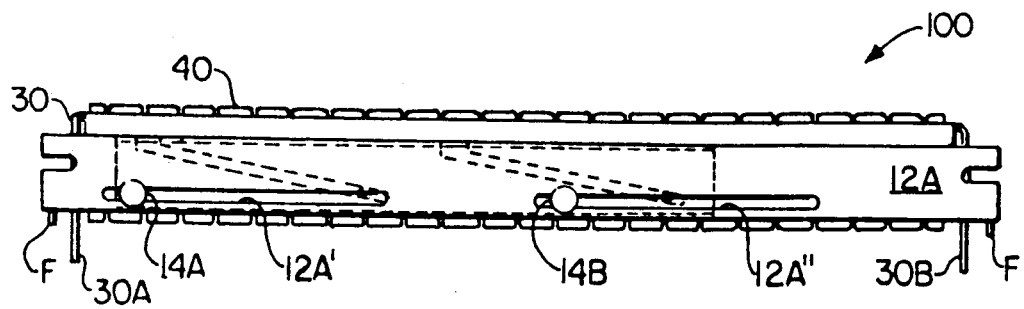
FIG. 3 is a front elevational view of a shelf assembly in accordance with the present invention.
Figure 4:
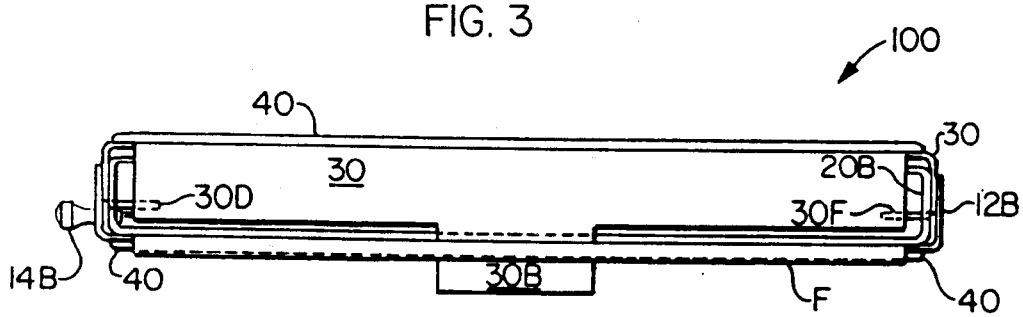
FIG. 4 is a side elevational view of a shelf assembly in accordance with the present invention.
Figure 5:
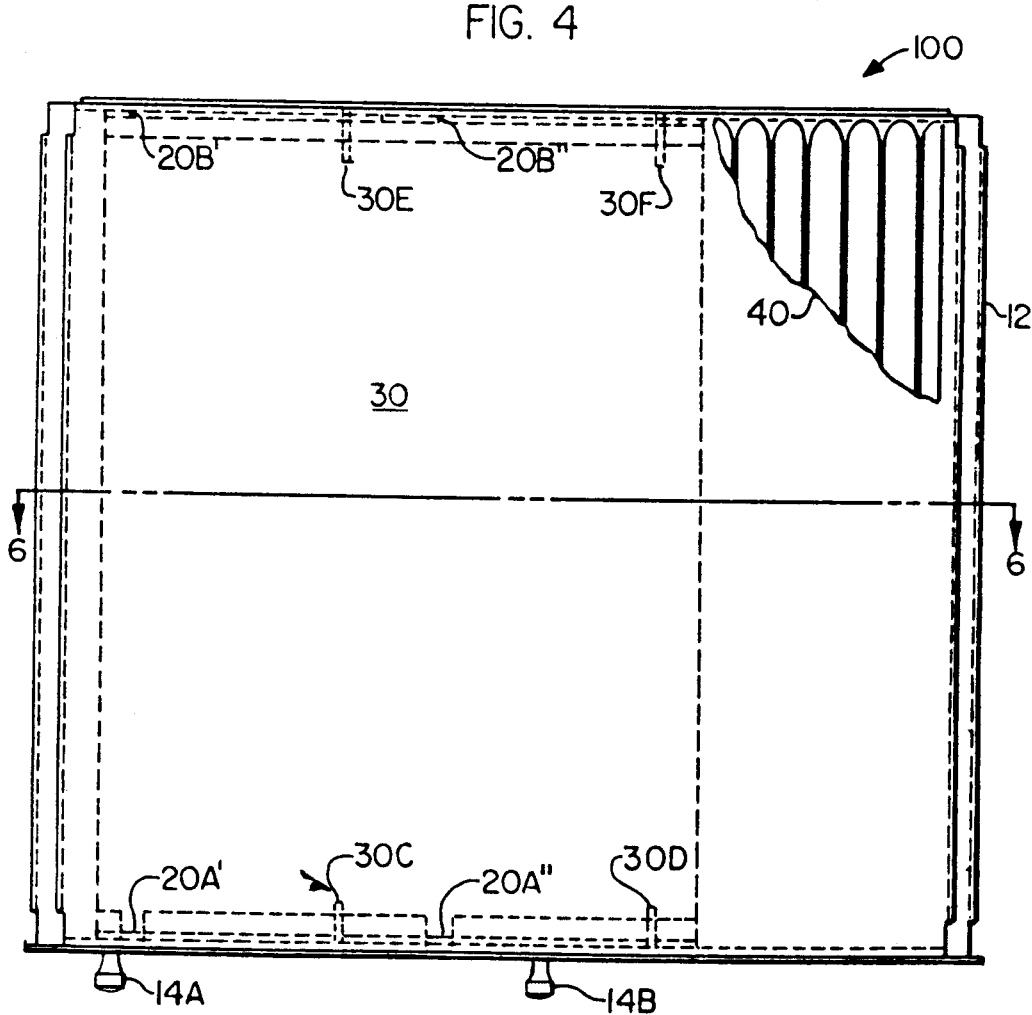
FIG. 5 is a top plan view of a shelf assembly in accordance with the present invention.
Figure 6A:
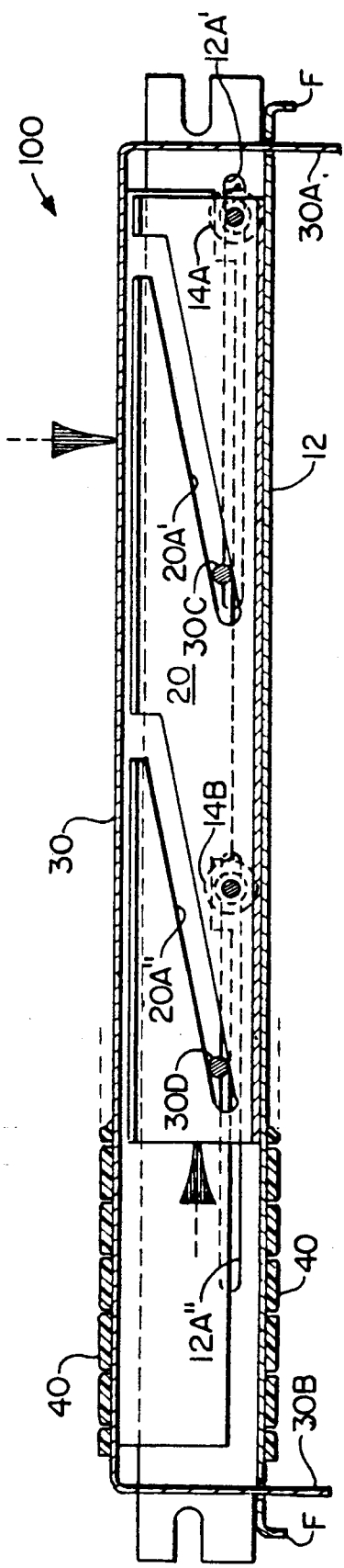
FIGS. 6A and 6B are fragmentary vertical cross-sectional views of a shelf assembly in accordance with the present invention with the top surface lowered and raised, respectively.
Figure 6B:
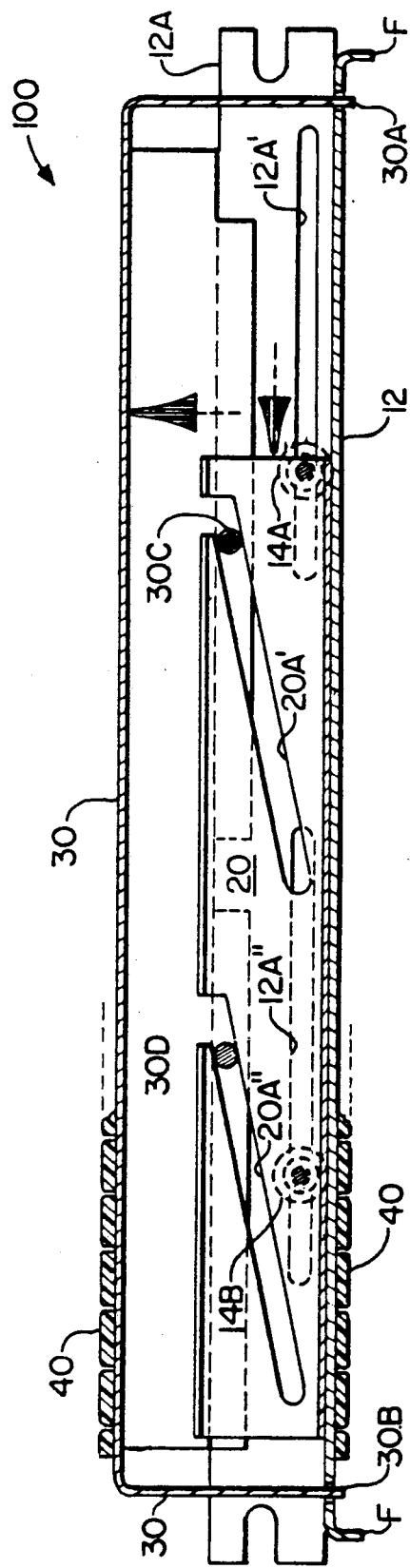

The shelf of the present invention is adapted to be mounted in an electronic circuit board storage cabinet of the type manufactured by Newton Instrument Company of Butner, North Carolina as Part No. 2101250000. However, applicant contemplates that the infinitely vertically adjustable shelf of the present invention may also be used in other storage cabinets.

Referring now to the drawings, infinitely vertically adjustable shelf 100 can be seen to comprise a shelf base 12 having a planar bottom surface, an upturned front wall 12A and an upturned back wall 12B. Front wall 12A defines two spaced-apart elongate slots 12A' and 12A" therein for receiving thumb screws 14A and 14B, respectively, therethrough. The bottom surface of shelf base 12 defines elongate apertures 16A and 16B therein adjacent each opposing side of shelf base 12.

Vertical adjustment tray 20 is positioned on the planar bottom surface of shelf base 12 and adapted for lateral slidable movement thereon from one side to the other of shelf base 12. Vertical adjustment tray 20 includes an upturned front wall 20A and an upturned back wall 20B. Front wall 20A has two upwardly extending slots 20A' and 20A' therein. Slots 20A' and 20A' each extend generally laterally upwardly in the same direction and at the same angle as the other, and are open at the uppermost end thereof in front wall 20A. Back wall 20B of vertical adjustment tray 20 includes two upwardly extending elongate slots 20B' and 20B' which are substantially identical to corresponding slots 20A' and 20A" in front wall 20A. Two threaded grommets TG are also provided in front wall 20A of vertical adjustment tray 20 in order to threadably receive thumb screws 14A and 14B when vertical adjustment tray 20 is positioned so as to rest on the planar bottom surface of shelf base 12. In this fashion, thumb screws 14A and 14B may be moved laterally within corresponding slots 12A' and 12A" of shelf base 12 in order to laterally translate vertical adjustment tray 20 as desired, and thumb screws 14A and 14B may then be tightened to lock shelf base 12 in position.

Next, shelf top 30 is provided to rest on vertical adjustment tray 20 and to be vertically adjusted thereby in a fashion which will be described hereinafter. Shelf top 30 includes a wall downturned on each side thereof. The side walls of shelf top 30 each include a downwardly extending tab 30A and 30B which are shaped so as to be vertically received within corresponding aperture 16A and 16B, respectively, of shelf base 12 in order to secure shelf top 30 to shelf base 12 in a fashion which prevents lateral movement of shelf top 30 relative to shelf base 12 while allowing vertical movement thereof as vertical adjustment tray 20 is laterally translated between shelf base 12 and shelf top 30. Also, the front wall of shelf top 30 includes two elongate peg members 30C and 30D which extends generally inwardly therefrom, and the back wall of shelf top 30 includes two elongate peg members 30E and 30F which extend generally inwardly therefrom and correspond to peg members 30C and 30D in the front wall of shelf top 30.

Peg members 30C and 30D are positioned so as to be slidably received within upwardly extending slots 20A' and 20A", respectively, of vertical adjustment tray 20. Pegs 30E and 30F are positioned so as to be slidably received within upwardly extending slots 20B' and 20B", respectively, of vertical adjustment tray 20. Thus, shelf top 30 will be vertically raised or lowered by laterally translating vertical adjustment tray so as to urge peg members 30C-30F of shelf top 30 upwardly along slots 20A', 20A", 20B', 20B", respectively, of vertical adjustment tray 20. Although movement of peg members 30C-30F within corresponding upwardly extending slots of vertical adjustment tray 20 will cause shelf top 30 to be vertically raised or lowered, shelf top 30 will be prevented from moving laterally by tabs 30A and 30B which reside in corresponding apertures 16A and 16B of shelf base 12.

Finally, it can be seen with reference to the drawings that the top surface of shelf top 30 and the lower surface of shelf base 12 are provided with plastic mats 40 which define a plurality of parallel grooves therein for slidably receiving the edge of electronic circuit boards. Although any suitable means may be utilized, plastic mats 40 each preferably have clips molded into the bottom side thereof (not shown) for attaching to the top surface of shelf top 30 and the lower surface of shelf base 12.

As can be appreciated with reference to FIG. 1 of the drawings, shelf assembly 100 is slidably positioned into a storage cabinet by placing the downturned flange F adjacent each side of shelf base 12 into a selected groove G positioned in vertical spaced-apart relationship along the length of each side of the storage cabinet. Once shelf assembly 100 has been slidably positioned within a suitable groove on each side of the storage cabinet, the front wall 12A of shelf base 12 may, as a matter of choice, be screwed into place on each side thereof to the storage cabinet (see FIG. 1). Most suitably the vertically spaced grooves on each side of the storage cabinet are spaced apart about ⅜ inches so as to accommodate a first preliminary vertical adjustment of shelf assembly 100. A fine vertical adjustment of shelf top 30 of shelf assembly 100 may be made by suitable lateral movement of thumb screws 14A and 14B to selectively vertically adjust shelf top 30 to a desired location. Preferably, shelf top 30 may be infinitely vertically adjusted up to about ⅜ of an inch (or to the next vertically spaced-apart groove on each side of the storage cabinet).

In operation, electronic circuit boards C are slidably received between two properly adjusted shelf assemblies 100. If a different size circuit board is to be stored in the storage cabinet, a fine adjustment of up to ⅜ of an inch may be made merely by loosening, laterally moving, and then tightening thumb screws 14A and 14B so as to suitably vertically adjust shelf top 30 of the lower shelf assembly 100. Thus, as will now be appreciated, the ⅜ inch of fine adjustment provided by thumb screws 14A and 14B of shelf assembly 100 when used in combination with the preliminary adjustment of discrete ⅜ inch vertical movements provided by the spaced grooves G along each side of the storage cabinet allows for essentially infinite adjustability of shelf assembly 100.

By fabricating plastic mats 40 from a suitable static dissipative fire-retardant plastic, and the shelf top 30, vertical adjustment tray 20, and shelf base 12 from conductive metal, the charge dissipated by shelf assemblies 100 will be conducted away therefrom through the metal storage cabinet and from the ground lug assembly on the cabinet to a central office grounding system in order to prevent electro-static discharge (ESD).

Although shelf assembly 100 has been shown and described in its upright position herein, applicant contemplates that shelf assembly 100 could be used in an inverted position. In this configuration shelf top 30 would serve as an infinitely vertically adjustable bottom of the shelf assembly and shelf base 12 would serve as the stationary top thereof.

It will thus be seen that there has been described above a static-dissipative, infinitely vertically adjustable shelf assembly for use in storage cabinets for electronic circuit boards used in such industries as telecommunications and electronics, and providing for ease of installation and vertical adjustment which have not been known heretofore.

It will be understood that various details of the invention may be changed without departing from the scope of the invention. Furthermore, the foregoing description is for the purpose of illustration only, and not for the purpose of limitation—the invention being defined by the claims.

What is claimed is:

1. A vertically adjustable shelf assembly for use in storage cabinets and the like comprising:

a shelf base adapted to be secured to a storage cabinet and having a bottom support surface, said base further having a front wall extending along at least a portion of the length of the front side thereof and defining at least one generally horizontally extending elongate opening therein;

vertical adjustment means positioned on said support surface of said base and adapted for lateral slidable movement thereon, said adjustment means comprising a member having front and rear sides and front wall and a rear wall extending along at least a portion of the length of the front and rear sides thereof, respectively, and each defining at least one elongate guide surface extending generally laterally upwardly, said vertical adjustment means further comprising lateral movement means secured to said front wall thereof and extending through said at least one elongate opening in the front wall of said base so that lateral movement of said lateral movement mean will laterally translate said vertical adjustment means relative to said base; and a shelf top movably secured relative to said shelf base so as to prevent lateral movement thereof while allowing vertical movement relative to said base, said top having front and rear sides and a front wall and rear wall extending along at least a portion of the length of the front and rear sides thereof, respectively, and guide surface engagement means extending inwardly from said front and rear walls and into operative engagement with said at least one laterally upwardly extending guide surface in each of said front and rear walls of said vertical adjustment means so that selective lateral movement of said vertical adjustment means in a direction to urge said guide surface engagement means upwardly along said guide surfaces therein serves to vertically raise said top, and lateral movement of said vertical adjustment means in a direction to urge said guide surface engagement means downwardly along said guide surfaces therein serves to vertically lower said top.

2. A vertically adjustable shelf assembly according to claim 1 wherein said base front wall defines two spaced-apart generally horizontally extending elongate slots therein.

3. A vertically adjustable shelf assembly according to claim 2 wherein said base comprises a back wall extending along at least a portion of the length of the back side thereof.

4. A vertically adjustable shelf assembly according to claim 1 wherein said front wall and rear wall of said vertical adjustment means each defines two spaced-apart elongate slots therein extending generally laterally upwardly, each of said two slots extending generally laterally upwardly in the same direction and at the same angle as the other.

5. A vertically adjustable shelf assembly according to claim 4 wherein said two spaced-apart elongate slots in said back wall of said vertical adjustment means are substantially identical in length to those in the front wall thereof.

6. A vertically adjustable shelf assembly according to claim 4 wherein said lateral movement means comprises two adjustment knobs secured to said front wall of said vertical adjustment means, and each extends through a respective one of two elongate openings provided in said base front wall.

7. A vertically adjustable shelf assembly according to claim 1 wherein said shelf top defines a downwardly extending tab member on each side thereof and said shelf base defines a corresponding aperture adjacent each side of the bottom support surface thereof for slidably receiving said tab member therein.

8. A vertically adjustable shelf assembly according to claim 7 wherein said guide surface engagement means of said shelf top comprises elongate peg members.

9. A vertically adjustable shelf assembly according to claim 1 wherein said vertically adjustable shelf assembly includes a grooved plastic mat secured to the top surface of said shelf top and to the bottom surface of said shelf base, respectively, for slidably receiving items to be stored.

10. A vertically adjustable shelf assembly according to claim 9 wherein said grooved plastic mats are fabricated from static-dissipative, fire retardant plastic.

11. A telecommunications electronic circuit board storage cabinet comprising a plurality of vertically adjustable shelf assemblies according to claim 1.

12. A vertically adjustable shelf assembly for use in storage cabinets and the like comprising:

a shelf base adapted to be secured to a storage cabinet and having a bottom support surface with front and rear sides and opposing sides extending therebetween and having an aperture defined adjacent each opposing side thereof, said base further having a front wall extending along at least a portion of the length of the front side thereof and defining two spaced-apart generally horizontally extending elongate slots therein;

vertical adjustment means positioned on said support surface of said base and adapted for lateral slidable movement thereon, said adjustment means comprising member having front and rear sides and a front wall and a rear wall extending along at least a portion of the length of the front and rear sides, respectively, thereof and each defining two spaced-apart elongate slots therein extending generally laterally upwardly, said vertical adjustment means further comprising two lateral adjustment knob members secured to said front wall thereof and each extending through a respective one of said two elongate slots in the front wall of said base so that lateral movement of said knob members will laterally translate said vertical adjustment means relative to said base; and a shelf top having a front and rear sides and opposing sides extending therebetween and having downwardly extending tab member on each of said opposing sides thereof corresponding to the aperture on each side of said bottom support surface of said shelf base and being slidably received therein so as to prevent lateral movement of said shelf top while allowing vertical movement relative to said shelf base, said top having a front wall and rear wall extending along at least a portion of the front and rear sides thereof, respectively, and slot engagement means extending inwardly from said front wall and rear wall and into operative engagement with each of said two laterally upwardly extending slots in each of said front and rear walls of said vertical adjustment means so that selective lateral movement of said vertical adjustment means in a direction to urge said slot engagement means upwardly along said slots therein serves to vertically raise said top, and lateral movement of said vertical adjustment means in a direction to urge said slot engagement means downwardly along said slots therein serves to vertically lower said top.

13. A vertically adjustable shelf assembly according to claim 12 wherein said base comprises a back wall extending along at least a portion of the length of the back side thereof.

14. A vertically adjustable shelf assembly according to claim 12 wherein said two spaced-apart elongate slots of said back wall of said vertical adjustment means are substantially identical in length to said two slots in the front wall thereof.

15. A vertically adjustable shelf assembly according to claim 12 wherein said slot engagement means of said shelf top comprises elongate peg members.

16. A vertically adjustable shelf assembly according to claim 12 wherein said vertically adjustable shelf assembly includes a grooved plastic mat secured to the top surface of said shelf top and to the bottom surface of said shelf base, respectively, for slidably receiving items to be stored.

17. A vertically adjustable shelf assembly according to claim 16 wherein said grooved plastic mats are fabricated from static-dissipative, fire retardant plastic.

18. A telecommunications electronic circuit board storage cabinet comprising a plurality of vertically adjustable shelf assemblies according to claim 12.

* * * * *